United States Patent [19]
Nakasuji

[11] Patent Number: 6,011,268
[45] Date of Patent: Jan. 4, 2000

[54] DEMAGNIFYING PROJECTION-OPTICAL SYSTEM FOR ELECTRON BEAM LITHOGRAPHY WITH ABERRATION CONTROL

[75] Inventor: Mamoru Nakasuji, Yokohama, Japan

[73] Assignee: Nikon Corporation, Tokyo, Japan

[21] Appl. No.: 09/120,260

[22] Filed: Jul. 21, 1998

[30] Foreign Application Priority Data

Jul. 30, 1997 [JP] Japan .................................. 9-218342

[51] Int. Cl.[7] ................................................ H01J 37/30
[52] U.S. Cl. ............................ 250/492.22; 250/492.23; 250/398; 250/396 ML
[58] Field of Search ...................... 250/492.22, 492.23, 250/398, 396 ML, 492.2

[56] References Cited

U.S. PATENT DOCUMENTS 5,663,568  9/1997  Waskiewicz ........................ 250/492.2
5,847,402  12/1998 Nakasuji ........................ 250/396 ML

FOREIGN PATENT DOCUMENTS 7-235469  9/1995  Japan .

*Primary Examiner*—Kiet T. Nguyen
*Attorney, Agent, or Firm*—Klarquist Sparkman Campbell Leigh & Whinston, LLP

[57] ABSTRACT

Electron-beam demagnifying projection-optical systems are disclosed that perform magnification adjustment, image-rotation adjustment, and focus correction while not contributing to aberrations. Also disclosed are electron-beam microlithography apparatus comprising such a projection-optical system. The projection-optical system comprises first and second projection lenses arranged on an optical axis, and project an electron beam, that has passed through a mask pattern, with demagnification on a substrate. Each projection lens includes an auxiliary lens that generates a magnetic field having an axial strength distribution proportional to the axial magnetic field distribution of the respective projection lens. By adjusting the direction and amount of electrical current through the auxiliary lenses at least of focal point, image rotation, and image magnification can be independently adjusted.

16 Claims, 3 Drawing Sheets

DEMAGNIFYING PROJECTION-OPTICAL SYSTEM FOR ELECTRON BEAM LITHOGRAPHY WITH ABERRATION CONTROL

FIELD OF THE INVENTION

This invention pertains to electron-beam microlithography. More specifically, the invention pertains to demagnifying projection-transfer apparatus employing an electron beam to transfer a pattern, defined by a mask, onto a wafer or other suitable sensitized substrate at high accuracy and high throughput, the pattern having high-density features with minimum linewidths of 0.12 μm or less such as would be required to produce DRAMS of 4 GB or more.

BACKGROUND OF THE INVENTION

Electron-beam microlithography apparatus are known for use in manufacturing integrated circuits and the like, including such apparatus that "reductively" (i.e., with demagnification) transfer a pattern defined by a mask onto a wafer using a two-stage projection lens. In this regard, reference is made to Japanese Laid-Open patent document no. HEI 5-160012. With such apparatus, it is generally not possible to simultaneously illuminate the entire mask with the electron beam. Consequently, the mask is typically subdivided into multiple mask subfields and the mask pattern is transferred to the wafer one subfield at a time. See, e.g., U.S. Pat. No. 5,260,151.

Electron-beam projection-optical systems used in conventional electron-beam microlithography apparatus include "SMD" (Symmetric Magnetic Doublet) and "PREVAIL" (Projection Exposure by Variable Axis Immersion Lens) systems. Such projection-optical systems are usually "two-stage" by which is meant that the projection-optical system comprises two individual projection lenses arranged in tandem along an optical axis.

It is desired that a two-stage demagnifying projection-optical system based on the SMD concept allow adjustment of the focal point of the projection-optical system without changing the magnification of the projection-optical system and without causing rotation of the image produced by the projection-optical system. Adjustments to the focal point can be made by increasing or reducing, by the same magnitude, the electrical current applied to the constituent projection lenses.

In certain conventional projection-optical systems, one projection lens has a "split" coil that, in the direction of the optical axis, comprises two lens coils. A split coil allows alteration of a ratio of electrical current flowing through the pair of coils while maintaining the same total current applied to the respective projection lens. Reference is made to Lischke et al., "Investigations about High Performance Electron-Microprojection Systems," *Proceedings of the Eighth Int. Conf. on Electron and Ion Beams in Science and Technology*, Seattle (USA), 1978.

Japanese Laid-Open patent document no. HEI 7-235469 discloses an electron-beam projection-optical system consisting of a first projection lens that primarily adjusts the magnification of the transferred image and a second projection lens that primarily adjusts rotation of the image.

The conventional projection-optical systems summarized above do not adequately control aberrations generated whenever the lens magnification is changed or whenever the image rotation is adjusted. These projection-optical systems also do not adequately minimize changes in image rotation and/or focal point that arise when the magnification is changed.

SUMMARY OF THE INVENTION

An object of the invention is to provide an electron-beam demagnifying projection-transfer apparatus that can perform magnification adjustments, image-rotation adjustments, and focal-point corrections electrically in a short period of time, thereby effectively preventing the generation of aberrations whenever such corrections are made.

To such end, and according to a first aspect of the invention, projection-optical systems are provided for projecting an image of a mask pattern region, that is irradiated by an electron beam, onto a substrate. The projection-optical system comprises, from mask-wise to substrate-wise, on an optical axis first and second projection lenses.

According to a preferred embodiment, the first projection lens comprises a pole piece, a main coil for generating a magnetic field extending along the optical axis, a magnetic shield, and an auxiliary lens. The main coil is concentric with the pole piece. The magnetic shield is preferably axially coextensive with the main coil and is situated radially interiorly to an inside diameter of the main coil. The auxiliary lens comprises at least one coil, is axially coextensive with the main coil, and is preferably situated interiorly to the magnetic shield.

Further according to a preferred embodiment, the second projection lens comprises a pole piece, a main coil for generating a magnetic field extending along the optical axis, a magnetic shield, and an auxiliary lens. The main coil is concentric with the pole piece. The magnetic shield is preferably axially coextensive with the main coil and is situated radially interiorly to an inside diameter of the main coil. The auxiliary lens comprises at least one coil, is axially coextensive with the main coil, and is preferably situated interiorly to the magnetic shield. The second projection lens is dimensioned relative to the first projection lens according to a demagnification ratio of the projection-optical system.

Each of the auxiliary lenses generates a magnetic field having an axial field-strength distribution that is preferably proportional to the axial field-strength distribution of the respective magnetic field produced by the respective projection lens. By adjusting the direction and amount of electric current flowing through one or more coils in the auxiliary lenses, any one or more (depending on the number of coils in the auxiliary lenses) of focal point location, image rotation, and image magnification can be independently changed while minimizing change to the other parameters.

Each magnetic shield preferably comprises a "ferrite stack" preferably comprising an axially extended stack of multiple alternately arranged ferrite rings and insulating rings.

As noted above, each auxiliary lens can comprise multiple coils. When multiple coils are present, they are preferably arranged around the optical axis equidistantly from each other and from the optical axis. Alternatively or in addition, each auxiliary lens can comprise a upstream half portion and a downstream half portion. Each half portion comprises at least one respective coil that can be independently energized.

According to another aspect of the invention, electron-beam projection-transfer apparatus are provided. According to a first representative embodiment, such an apparatus comprises an electron-beam illumination-optical system and a projection-optical system. The illumination-optical system is operable to illuminate a region of a mask pattern using an electron beam. The projection-optical system is situated downstream of the illumination-optical system so as to receive the electron beam passing through the illuminated region of the mask from the illumination optical system and produce a demagnified projected image of the illuminated region on a substrate such as a wafer. The substrate is located axially downstream of the projection-optical system.

The projection-optical system comprises first and second projection lenses. Each of the projection lenses produces a respective magnetic field. Each of the projection lenses also comprises a respective auxiliary lens. Each auxiliary lens comprises at least one coil operable to produce, according to direction and magnitude of electrical current passing through the respective coil(s), a respective magnetic field(s) having a field strength smaller than the magnetic field generated by the respective first and second projection lens. The magnetic field generated by each auxiliary lens has an axial field-strength distribution that is proportional to an axial field-strength distribution of the respective first and second projection lens so as to independently adjust one or more of focal point, image rotation, and image magnification.

The polarity of the respective magnetic field(s) generated by the auxiliary lenses can be the same as or opposite the respective magnetic field produced by the respective projection lens. This can be of especial utility when the auxiliary lenses are used to correct focal point position.

The auxiliary lenses can be operable to correct image rotation by generating respective axial magnetic fields having the same polarity.

The auxiliary lenses can be operable to adjust magnification by generating respective magnetic fields that add to or subtract from the magnetic fields of the respective first and second projection lenses.

In the projection-optical system in the projection-transfer apparatus embodiment summarized above, each projection lens preferably comprises a respective magnetic shield that is coaxial with the respective projection lens. Each magnetic shield preferably comprises a tubular stack constructed of alternating rings of ferrite and an insulating material, the tubular stack extends in an axial direction inside a bore of the respective projection lens. The respective auxiliary lens is situated between the respective magnetic shield and the optical axis.

According to another representative embodiment, electron-beam demagnifying projection-transfer apparatus are provided that comprise an electron-beam illumination-optical system and a projection-optical system. The illumination-optical system illuminates a region of a mask pattern with an electron beam. The projection-optical system comprises first and second projection lenses. The projection-optical system is located downstream of the illumination-optical system so as to receive the electron beam passing through the illuminated region of the mask and produce a demagnified image of the illuminated region on a substrate located axially downstream of the projection-optical system.

The first projection lens has associated therewith first and second auxiliary lenses, and the second projection lens has associated therewith third and fourth projection lenses. Each auxiliary lens comprises at least one coil operable to produce, according to the direction and magnitude of electrical current passing through the respective coil, a respective auxiliary magnetic field having a field strength smaller than the magnetic field generated by the respective projection lens. The magnetic field generated by each auxiliary lens has an axial field strength distribution that is proportional to the axial field strength distribution of the respective projection lens so as to independently adjust at least one of focal point, image rotation, and image magnification.

The image projected by the projection-optical system has a magnification that is adjusted by causing a respective electrical current to flow through each of the first, second, third, and fourth auxiliary lenses so as to generate a respective magnetic field. The magnetic field generated by the first auxiliary lens has opposite polarity to the magnetic field generated by the second auxiliary lens, and the magnetic field generated by the third auxiliary lens has opposite polarity to the magnetic field generated by the fourth auxiliary lens. Also, the magnetic field generated by the first auxiliary lens preferably has similar polarity to the magnetic field generated by the third auxiliary lens.

The projection lenses in the second representative embodiment can comprise respective magnetic shields as summarized above with respect to the first representative embodiment.

The foregoing and additional features and advantages of the invention will be more readily apparent from the following detailed description, which proceeds with reference to the accompanying drawings.

DETAILED DESCRIPTION

Figure 2:
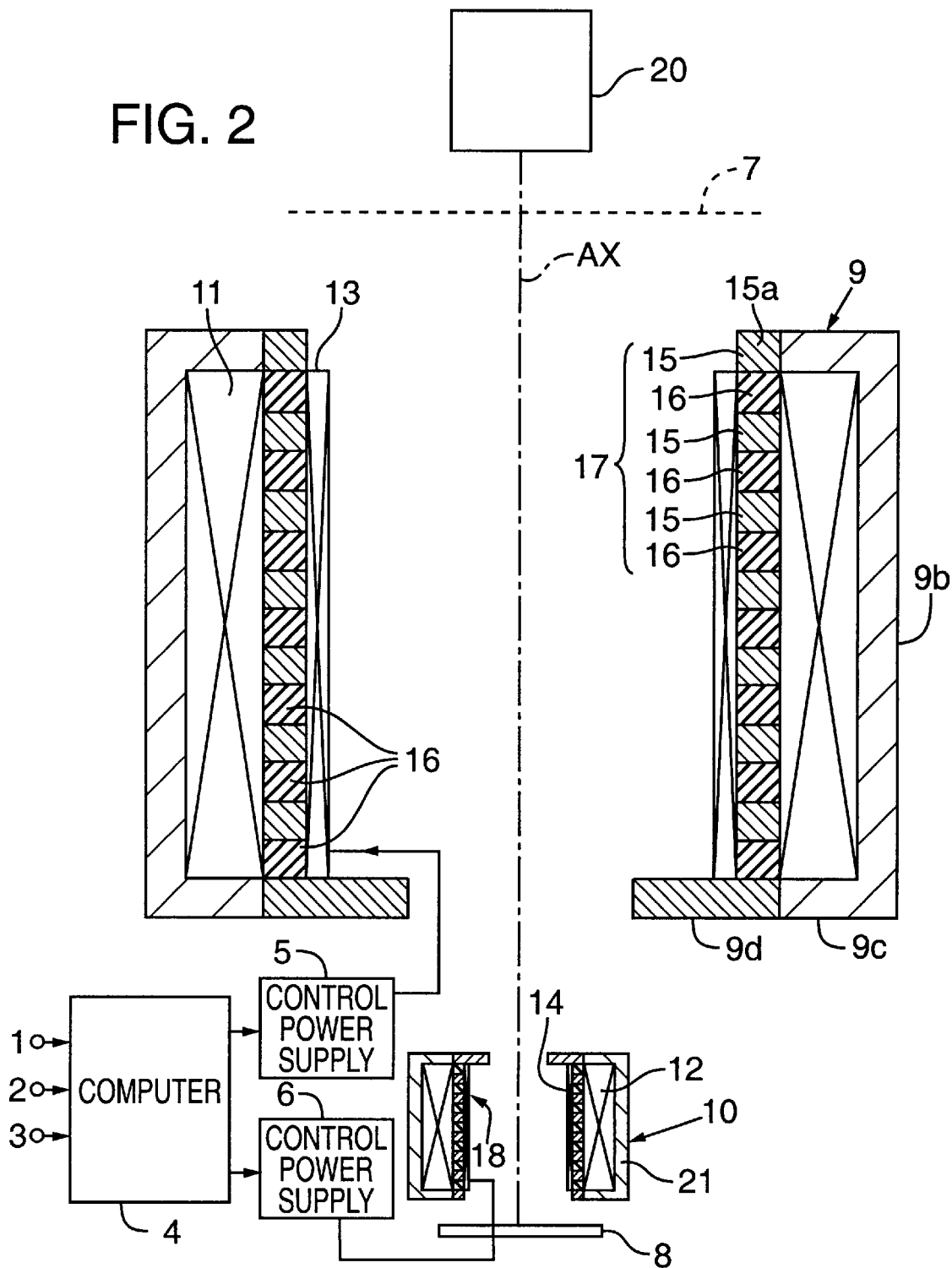
FIG. 2 is a schematic sectional elevational view of a projection optical system according to a first representative embodiment.
Figure 3:
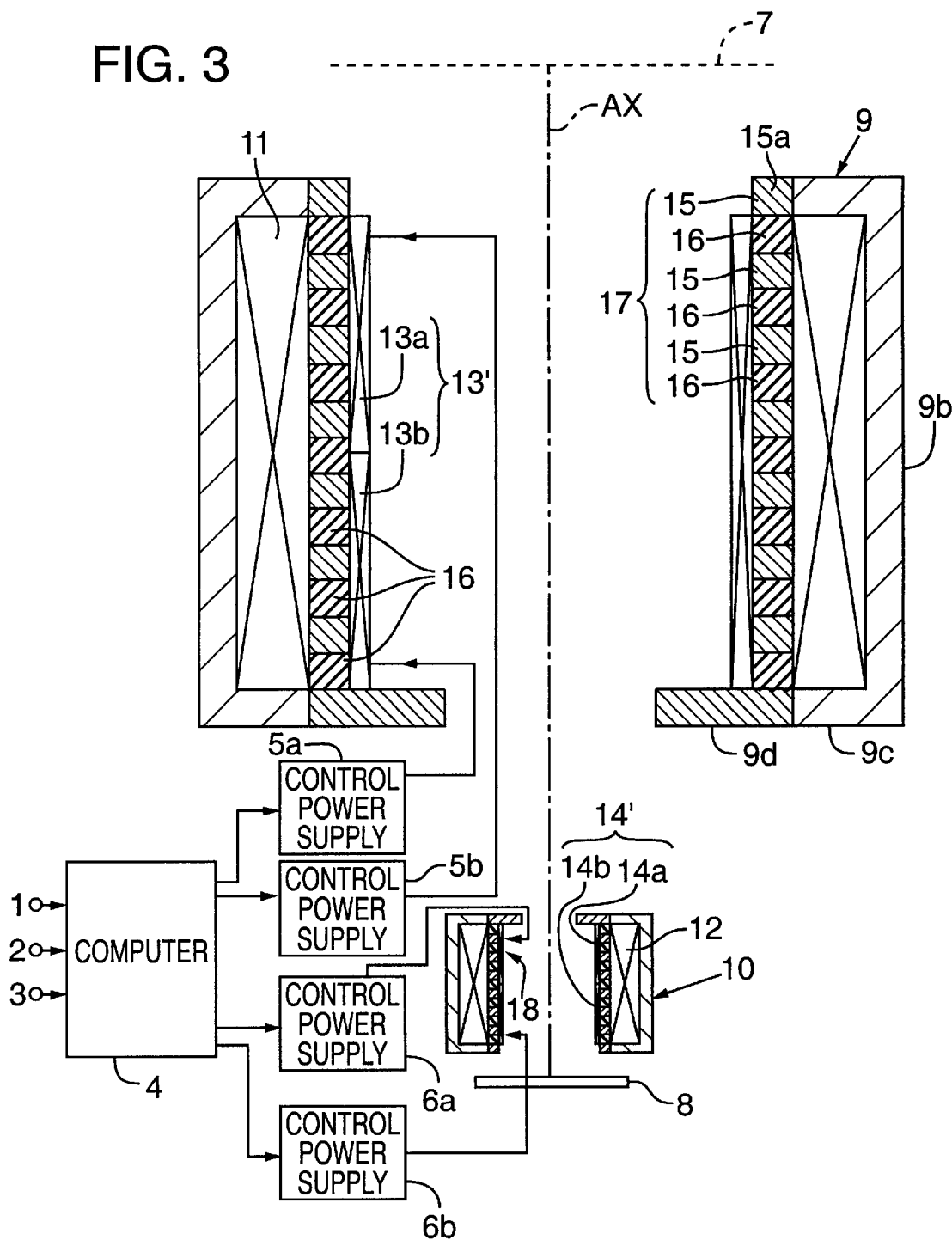
FIG. 3 is a schematic sectional elevational view of a projection optical system according to a second representative embodiment.

An electron-beam demagnifying projection-transfer apparatus according to the invention preferably comprises a "two-stage" projection-optical system, by which is meant that the projection-optical system comprises a first projection lens and a second projection lens arranged in tandem along an optical axis. Reference is made to FIGS. 2 and 3 that depict two representative embodiments. Referring, e.g., to FIG. 2, the projection-optical system comprises, from objectwise to imagewise along an optical axis AX, a first projection lens 9, and a second projection lens 10. The first and second projection lenses are preferably arranged in a symmetric magnetic doublet (SMD) configuration. The first projection lens 9 comprises a main coil 11, a pole piece 9b, a magnetic shield 17 (preferably a "ferrite stack" as described below), and a first auxiliary lens 13. The magnetic shield 17 and first auxiliary lens 13 are concentric with the main coil 11. The second projection lens 10 comprises a main coil 12, a pole piece 21, a magnetic shield 18, and a second auxiliary lens 14. The first projection lens 9 is generally situated just downstream of a mask 7, and the second projection lens 10 is generally situated just upstream of a wafer 8 or other substrate. Other features of a projection-optical system according to the invention, including other features shown in FIGS. 2 and 3, are discussed further below.

As summarized above, projection-optical systems according to the invention preferably comprise a magnetic shield preferably comprising a tubular "ferrite stack" or an analogous magnetic-shielding feature. A separate magnetic shield 17, 18 is preferably situated coaxially inside the bore of each of the first and second projection lenses 9, 10, respectively. Each ferrite stack 17, 18 preferably comprises alternating rings of ferrite and an insulating material coaxially "stacked" superposedly in the axial direction of the respective projection lens.

The auxiliary lenses 13, 14 are preferably situated between the respective magnetic shield and the optical axis AX. The auxiliary lenses allow rapid setting of image rotation, magnification, and lens focal point. Each auxiliary lens preferably comprises multiple (e.g., four) separate auxiliary-lens coils spaced equidistantly from one another around the optical axis AX. Using such auxiliary lenses, any of the three parameters of image rotation, magnification, and lens focal point can be individually adjusted with no effect on the other parameters.

Figure 1:
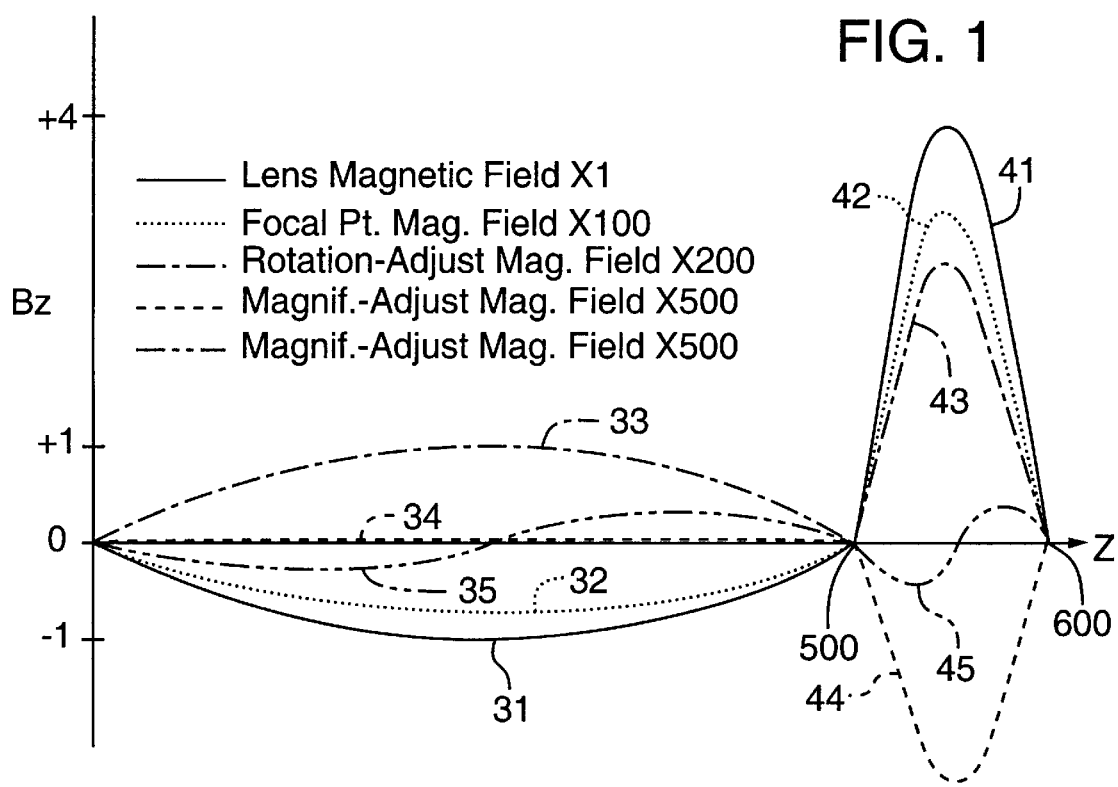
FIG. 1 illustrates exemplary axial magnetic field distributions produced by various embodiments of a projection-optical system according to the present invention, as used in an electron-beam demagnifying projection-transfer apparatus.

FIG. 1 illustrates an axial magnetic field-strength distribution exhibited by a projection optical system, according to the invention, when used in an electron-beam demagnifying projection-transfer apparatus. The abscissa indicates position, along the optical axis of the projection-optical system, from the mask to the wafer. The ordinate indicates the strength ($B_z$) of the magnetic field along the optical axis in the direction of the optical axis (Z direction). The distance from 0–500 mm on the abscissa is the axial length of the first projection lens, and the distance from 500–600 mm is axial length of the second projection lens.

In FIG. 1, the left-hand curve 31 (indicated by a solid line) denotes the magnetic field-strength distribution of the "main body" of the first projection lens. (As used herein, the "main body" of a projection lens generally denotes the combination of the respective pole piece and respective main coil.) The right-hand curve 41 (indicated by a solid line) denotes the magnetic field-strength distribution of the main body of the second projection lens. The curve 31 intersects the abscissa (Z axis) at the origin (0) and at 500 mm. The curve 41 intersects the abscissa at 500 mm and at 600 mm. The center of each curve 31, 41 is at a maximal distance from the Z axis.

Referring further to FIG. 1, the curves 32 and 42, each indicated by a dotted line, denote the magnetic field-strength distribution (along the optical axis) of the auxiliary lenses of the first and second projection lenses, respectively, when performing a focal-point adjustment. Note that, with respect to the curves 32, 42, the scale of the ordinate is expanded by a factor of 100 compared to the ordinate scale for curves 31, 41, so as to more clearly illustrate the respective magnetic field-strength distribution. Hence, the magnitude of the magnetic field used for focal-point adjustment is preferably no greater than 1/100th of the magnitude of the magnetic field produced by the main body of the respective projection lens.

The magnetic field-strength distribution (along the optical axis AX) indicated by the curves 32, 42 are preferably generated by the respective auxiliary lenses in conjunction with the axial magnetic fields generated by the main bodies of the respective projection lenses (curves 31, 41). This provides the two-stage projection lens system with greater refractive power and a correspondingly shorter focal length. This also allows the focal surface of the mask to be lowered (i.e., moved closer along the optical axis to the wafer) and the focal surface of the wafer to be raised (i.e., moved closer along the optical axis to the mask). However, because such an adjustment causes the respective integrals of the curves 32, 42 along the Z axis (i.e., the optical axis) to cancel each other out, no net change occurs in the rotation of the transferred image. Also, since there is no change in the position of the primary surface of each lens, no change occurs in magnification of the projection-optical system.

Further with respect to FIG. 1, curves 33, 43 (each indicated by a dot-dash line) denote the respective distributions of the axial magnetic field strength of the respective auxiliary lenses when being used to adjust rotation of the transferred image. As noted in the figure, the scale of the ordinate is expanded by a factor of 200, relative to the ordinate scale used for the curves 31, 41, to more clearly show the magnetic field-strength distributions 33, 43. The axial distribution of the magnetic field strength of the auxiliary lens associated with the first projection lens (curve 33) extends in a lateral direction (relative to the Z axis) that is opposite to the direction in which the axial distribution of the magnetic field strength of the main body of the second projection lens extends (curve 31). Also, the profile of the magnetic field strength denoted by the curve 33 is proportional to the profile of the magnetic field strength of the main body of the respective projection lens. Meanwhile, the axial distribution of the magnetic field strength of the auxiliary lens associated with the second projection lens (curve 43) extends in a lateral direction (relative to the Z axis) that is the same as the direction in which the axial distribution of the magnetic field strength of the main body of the respective projection lens extends (curve 41). Also, the profile of the magnetic field strength denoted by the curve 43 is proportional to the profile of the magnetic field strength of the main body of the respective projection lens.

Rotation of the transferred image can be obtained in proportion to a respective integral of the magnetic field-strength curves 33, 43 from Z=0 to Z=600. When the auxiliary lenses are used in such a way, the first projection lens is weakened while the second projection lens is made stronger, which results in no net change in focal point of the projection-optical system, at least in a first approximation. This also results in no change in magnification, at least in a first approximation. More specifically, because the first projection lens is slightly weakened due to the effect of the magnetic field 33 produced by the respective auxiliary lens, a principal ray entering the first projection lens from the mask parallel to the optical axis crosses the optical axis at a point slightly maskwise of the normal crossover point (nominally at Z=500 mm). Because the second projection lens is slightly strengthened due to the effect of the magnetic field 43 produced by the respective auxiliary lens, the focal length of the second projection lens is shortened. This causes the principal ray to cross the optical axis slightly closer to the second projection lens from the crossover. As a result, the second projection lens forms an image at virtually the same location on the wafer as before actuating lens rotation, and no net change occurs in magnification of the projection-optical system.

The curves 34, 44 (denoted in FIG. 1 by dashed lines) indicate the respective axial distributions of magnetic field strength of the auxiliary lenses associated with the first and second projection lenses, respectively, when being used for adjusting the magnification of the transferred image. The axial distribution 34 of the magnetic field strength on the first-projection-lens side is zero in the range Z=0–500 mm. In FIG. 1, the scale of the ordinate for the curves 34, 44 is expanded by a factor of 500 to more clearly depict the subject axial distributions of magnetic field strength. The axial distribution 44 on the second-projection-lens side extends in a direction that is opposite that of the axial distribution 41 of the main body of the second projection lens; also, the profiles of the axial distributions 41, 44 are proportional to each other. Generating the magnetic fields denoted by the curves 34, 44 weakens the power of the second projection lens without altering the power of the first projection lens; consequently, the net magnification is essentially unity. In this instance, focal point conditions and rotation may be affected, in which instance correction of focal point and rotation may be indicated.

The curves 35, 45 denoted by dot-dot-dash lines in FIG. 1 denote the axial distribution of magnetic field strength generated by the respective auxiliary lenses when used to adjust the magnification of the transferred image. Each of the auxiliary lenses preferably comprises two half portions each extending a respective half distance along the optical axis within the respective projection lens and the magnetic fields generated by the two half portions have orientations that are opposite each other. This is shown in FIG. 1, wherein the axial distribution 35 is negative for the first half portion (left half in FIG. 1) within the first projection lens (i.e., Z=0–250 mm) and positive for the second half portion (right half in FIG. 1) within the first projection lens (i.e., Z=250–500 mm). In addition, the axial distribution 45 is negative for the first half portion (left half in FIG. 1) within the second projection lens (i.e., Z=500–550 mm) and positive for the second half portion (i.e., Z=550–600 mm). Each of the curves 35 and 45 has a smoothly undulating sine wave profile in which the respective first-order differential is kept low. Note that the shape of each curve 35, 45 reflects this low first-order differential value, which value being shared with the overall axial magnetic field distribution shown in FIG. 1.

The axial distributions 35, 45 of magnetic field strength serve to strengthen the magnetic field strength produced by the respective projection lens over the first half of the respective axial extent of the respective projection lens. As a result, for example, if a principal ray propagating along a path that diverges from the optical axis enters the first projection lens, propagation of the ray through the first half (0–250 mm in FIG. 1) of the first projection lens causes the ray to propagate toward the optical axis. Because the magnetic field produced in the second half (250–500 mm in FIG. 1) of the first projection lens is weakened, propagation of a principal ray through the second half of the first projection lens results in the principal ray diverging from the path imposed by the first half and thus propagating away from the optical axis. However, the net effect is manifest merely with respect to the angle at which the principal ray was initially bent to return to its original state; thus, the principal ray emitted from the first projection lens intersects the optical axis at a point upstream of the crossover. Also, because the magnetic field produced by the first half (500–550 mm in FIG. 1) of the second projection lens is weakened, propagation of a principal ray through the first half of the second projection lens causes the principal ray to diverge further from the optical axis. But, because the magnetic field produced in the second half (550–600 mm in FIG. 1) of the second projection lens is strengthened, propagation of the principal ray is directed toward the optical axis. Unless otherwise adjusted, the second projection lens forms the image on the wafer at a location laterally displaced from the optical axis. In such a case, the magnification can be changed by making the transferred image larger (i.e., lowering the demagnification ratio).

With respect to aberrations, the axial distribution of the magnetic field strength collectively produced by the first and second projection lenses does not differ markedly from the curves 31, 41 in FIG. 1 regardless of the ratio at which the magnetic fields of the four auxiliary lens halves, as described above, are configured. I.e., the ratio between the first and second projection lenses deviates only very slightly. There is also very little change in the first-order differential of the axial magnetic field-strength distribution that would have a significant impact on aberration. Thus, there is substantially no increase in aberration.

FIG. 2 schematically depicts a first representative embodiment of a projection-optical system, with attendant control system, according to the invention, for use in an electron-beam projection-transfer apparatus. The projection optical system is situated between a mask 7 and a wafer 8 (as a representative substrate). The mask 7 is illuminated by an electron beam from an illumination optical system 20 situated upstream of the mask.

A principal ray of the illumination electron beam impinges perpendicularly on the mask 7 (i.e., the principal ray propagates parallel to the optical axis in the region of the mask).

Situated downstream of the mask 7 along the optical axis are a first projection lens 9 and a second projection lens 10. The first projection lens 9 comprises a "main body" that comprises a main coil 11 situated within a rotationally symmetric magnetic pole piece 9b. The pole piece 9b comprises an upper magnetic pole 9a and a lower magnetic pole 9c each radially extending toward the optical axis AX and covering the upper and lower end surfaces, respectively, of the coil 11. The first projection lens 9 also includes an upper ferrite ring 15a and a lower ferrite ring 9d arranged on the interior-facing edges of the upper magnetic pole 9a and the lower magnetic pole 9c, respectively. Lines of magnetic force extend between the two ferrite rings 15a, 9d in the direction of the optical axis AX.

The first projection lens 9 is lined with a magnetic shield preferably configured as a "ferrite stack" 17. The ferrite stack 17 comprises alternating layers of ferrite rings 15 and insulating rings 16. The outside diameter of each ring 15, 16 is essentially the same as the inside diameter of the main coil 11 and the outside diameter of each of the upper and lower magnetic poles 9a, 9c, respectively. The inside diameter of each of the rings 15, 16 (but not of the ferrite ring 9d) is essentially the same as the outside diameter of a first auxiliary lens 13 (described below). The ferrite stack 17 serves as a magnetic shield that keeps the magnetic field produced by the first auxiliary lens 13 from leaking outwardly. The inside edge of the ferrite ring 9d extends radially further into the interior of the first projection lens 9 toward the optical axis AX than the inside diameter of the first auxiliary lens 13.

The first auxiliary lens 13 comprises at least one coil (preferably multiple coils). The first auxiliary lens 13 has the same length along the optical axis AX as the main coil 11, but the number of windings in the first auxiliary lens 13 is smaller (one-tenth or less) than the number of windings in the main coil 11. The first auxiliary lens 13 is situated between the ferrite stack 17 and the optical axis AX, and is shielded by the ferrite stack 17 so that the lines of magnetic force do not penetrate outwardly. This allows rapid alteration of the axial magnetic field produced by the first auxiliary lens 13.

The second projection lens 10 is similar in shape to the first projection lens 9, but is proportionately (according to the demagnification ratio) smaller in size and oriented "upside down" relative to the first projection lens 9. The magnetic polarity of the second projection lens 10 is opposite the polarity of the first projection lens 9. In a manner similar to the first projection lens 9, the bore of the second projection lens 10 is lined with a ferrite stack 18 on the inside diameter of which is situated a second auxiliary lens 14.

Connected to the auxiliary lenses 13, 14 are respective control power supplies 5, 6. Electrical input signals 1, 2, 3 comprising data on desired corrections to be applied are conveyed to the control power supplies 5, 6 via a computer 4.

Inputs for the Z correction amount, θ correction amount, and magnification correction amount are represented by the signals 1, 2, and 3, respectively. From data included in the signals 1, 2, 3, the computer 4 calculates the current to be applied to the coils of the auxiliary lenses 13 and 14 to produce corresponding "adjustment" magnetic fields. Signals encoding data concerning desired corresponding current levels are conducted to the respective control power supplies 5, 6 to cause the calculated level of current to flow to the respective coils of the auxiliary lenses 13, 14, thereby achieving a correction corresponding to the input values for Z correction, θ correction, and magnification correction.

The auxiliary lenses 13, 14 can be configured according to simulations in which axial magnetic fields are generated in proportion to the axial magnetic field-strength distributions on the first and second projection lenses under conditions in which respective ferrite stacks are present. The configurations can be modified based on actual measurements.

The FIG. 2 embodiment can generate an axial magnetic field-strength distribution (curves 32, 42 in FIG. 1) for adjusting the focal point, an axial magnetic field distribution (curves 33, 43 in FIG. 1) for adjusting rotation, and a magnetic field (curves 34, 44) for adjusting magnification.

Selective application of corrective current to the coils of the auxiliary lenses 13, 14, causes virtually no change in the profile of the axial magnetic field-strength distribution for the first and second projection lenses 9, 10 so long as the applied correction currents are not large relative to the currents applied to the respective main coils. Consequently (as has been verified), no aberrations are generated.

FIG. 3 schematically depicts a second representative embodiment of a projection-optical system, with attendant control system, for use in an electron-beam projection-transfer apparatus. In the FIG. 3 embodiment, each of the first and second auxiliary lenses 13', 14', respectively, is split into two auxiliary-lens halves, namely an "upstream" half and a "downstream" half. Overall, each of the auxiliary lenses 13', 14' has the same axial length as the respective projection lens 9, 10; thus, each of the auxiliary lenses extends fully along the axial length of the respective projection lens 9, 10. Each half of the auxiliary lenses 13', 14' is independently controlled by a respective control power supply 5a, 5b, 6a, 6b. As a result, it is possible to alter the polarity and the strength of the upstream and downstream magnetic fields within each of the auxiliary lenses 13', 14'.

The FIG. 3 configuration can form a pair of corrective axial magnetic field-strength distributions that are inverted within each projection lens, as indicated by the curves 35, 45 in FIG. 1. This makes it possible to adjust the magnification of the transferred image.

As is clear from the foregoing description, this invention provides electron-beam demagnifying projection-transfer apparatus that can electrically adjust the magnification, rotation, and focal point in a short period of time while effectively eliminating aberrations.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A projection-optical system for projecting an image of a mask pattern region, irradiated by an electron beam, onto a substrate, the projection-optical system comprising from mask-wise to substrate-wise on an optical axis:

(a) a first projection lens comprising a pole piece, a main coil for conducting electrical current to cause the pole piece to generate a magnetic field extending along the optical axis, a magnetic shield, and an auxiliary lens, the main coil being concentric with the pole piece, the magnetic shield being axially coextensive with the main coil and being situated radially interiorly to an inside diameter of the main coil, and the auxiliary lens comprising at least one coil and being axially coextensive with the main coil, the auxiliary lens being situated radially interiorly to the magnetic shield;

(b) a second projection lens comprising a pole piece, a main coil for conducting electrical current to cause the pole piece to generate a magnetic field extending along the optical axis, a magnetic shield, and an auxiliary lens, the main coil being concentric with the pole piece, the magnetic shield being axially coextensive with the main coil and being situated radially interiorly to an inside diameter of the main coil, and the auxiliary lens comprising at least one coil and being axially coextensive with the main coil, the auxiliary lens being situated radially interiorly to an inside diameter of the magnetic shield; and (c) the second projection lens being dimensioned relative to the first projection lens according to a demagnification ratio of the projection-optical system.

2. The projection-optical system of claim 1, wherein each magnetic shield comprises a ferrite stack.

3. The projection-optical system of claim 2, wherein each ferrite stack comprises an axially extended stack of multiple alternately arranged ferrite rings and insulating rings.

4. The projection-optical system of claim 1, wherein each auxiliary lens comprises multiple coils.

5. The projection-optical system of claim 4, wherein the coils are arranged around the optical axis equidistantly from each other and from the optical axis.

6. The projection-optical system of claim 4, wherein each auxiliary lens comprises an upstream half portion and a downstream half portion, each half portion comprising a respective coil that can be independently energized.

7. An electron-beam demagnifying projection-transfer apparatus, comprising:

(a) an electron-beam illumination-optical system that illuminates a region of a mask pattern with an electron beam;

(b) a projection-optical system comprising a first projection lens and a second projection lens, the projection-optical system being situated downstream of the illumination-optical system so as to receive the electron beam passing through the illuminated region of the mask from the illumination-optical system and produce a demagnified projected image of the illuminated region of the mask on a substrate located axially downstream of the projection-optical system, each of the first and second projection lenses producing a respective magnetic field; and (c) a respective auxiliary lens associated with each of the first and second projection lenses, each auxiliary lens comprising at least one coil operable to produce, according to direction and magnitude of electrical current passing through the respective coil, a respective auxiliary magnetic field having a field strength smaller than the magnetic field generated by the respective first and second projection lens, the magnetic field generated by each auxiliary lens having an axial field-strength distribution that is proportional to an axial field-strength distribution of the respective first and second projection lens so as to independently adjust at least any one of focal point, rotation of transferred image, and image magnification.

8. The apparatus of claim 7, wherein the auxiliary lenses are operable to correct focal point by generating respective axial magnetic fields, the axial magnetic field of each auxiliary lens having a polarity that is either the same as or opposite the magnetic field produced by the respective projection lens.

9. The apparatus of claim 7, wherein the auxiliary lenses are operable to correct image rotation by generating respective axial magnetic fields, the axial magnetic field of each auxiliary lens being of identical polarity.

10. The apparatus of claim 9, wherein the auxiliary lenses are operable to correct focal point by generating respective axial magnetic fields, the axial magnetic field of each auxiliary lens having a polarity that is either the same as or opposite the magnetic field produced by the respective projection lens.

11. The apparatus of claim 7, wherein the auxiliary lenses are operable to adjust magnification by generating respective magnetic fields that add to or subtract from the magnetic fields of the respective first and second projection lenses.

12. The apparatus of claim 11, wherein the auxiliary lenses are operable to correct focal point by generating respective axial magnetic fields, the axial magnetic field of each auxiliary lens having a polarity that is either the same as or opposite the magnetic field produced by the respective projection lens.

13. The apparatus of claim 7, wherein the auxiliary lenses are operable to:

correct focal point by generating respective axial magnetic fields, the axial magnetic field of each auxiliary lens having a polarity that is either the same as or opposite the magnetic field produced by the respective projection lens;

correct image rotation by generating respective axial magnetic fields, the axial magnetic field of each auxiliary lens being of identical polarity; and adjust magnification by generating respective magnetic fields that add to or subtract from the magnetic fields of the respective first and second projection lenses.

14. The apparatus of claim 7, wherein each projection lens in the projection-optical system comprises a respective magnetic shield coaxial with the respective projection lens, the magnetic shield comprising a tubular stack constructed of alternating rings of ferrite and an insulating material, the tubular stack extending in an axial direction inside a bore of the respective projection lens, the respective auxiliary lens being situated between the respective magnetic shield and an optical axis of the projection lenses.

15. An electron-beam demagnifying projection-transfer apparatus, comprising:

(a) an electron-beam illumination-optical system that illuminates a region of a mask pattern with an electron beam;

(b) a projection-optical system comprising a first projection lens and a second projection lens, the projection-optical system being situated downstream of the illumination-optical system so as to receive the electron beam passing through the illuminated region of the mask from the illumination-optical system and produce a demagnified projected image of the illuminated region of the mask on a substrate located axially downstream of the projection-optical system, each of the first and second projection lenses producing a respective magnetic field;

(c) from the mask side to the substrate side, a first auxiliary lens and a second auxiliary lens associated with the first projection lens, and a third auxiliary lens and a fourth auxiliary lens associated with the second projection lens, each auxiliary lens comprising at least one coil operable to produce, according to direction and magnitude of electrical current passing through the respective coil, a respective auxiliary magnetic field having a field strength smaller than the magnetic field generated by the respective projection lens, the magnetic field generated by each auxiliary lens having an axial field-strength distribution that is proportional to an axial field-strength distribution of the respective projection lens so as to independently adjust at least any one of focal point, image rotation, and image magnification;

(d) wherein the image projected by the projection-optical system has a magnification that is adjusted by causing a respective electrical current to flow through each of the first, second, third, and fourth auxiliary lenses so as to generate a respective axial magnetic field, wherein the magnetic field generated by the first auxiliary lens has opposite polarity to the magnetic field generated by the second auxiliary lens, and the magnetic field generated by the third auxiliary lens has opposite polarity to the magnetic field generated by the fourth auxiliary lens, and the magnetic field generated by the first auxiliary lens has similar polarity to the magnetic field generated by the third auxiliary lens.

16. The apparatus of claim 15, wherein each projection lens in the projection-optical system comprises a respective magnetic shield coaxial with the respective projection lens, the magnetic shield comprising a tubular stack constructed of alternating rings of ferrite and an insulating material, the tubular stack extending in an axial direction inside a bore of the respective projection lens, the respective auxiliary lens being situated between the respective magnetic shield and an optical axis of the projection lenses.

* * * * *